(12) United States Patent
Kwon et al.

(10) Patent No.: US 10,839,864 B2
(45) Date of Patent: Nov. 17, 2020

(54) DYNAMIC POWER CONTROL SYSTEM FOR MEMORY DEVICE AND MEMORY DEVICE USING THE SAME

(71) Applicant: SAMSUNG ELECTRONICS CO., LTD., Suwon-si (KR)

(72) Inventors: Tae Hong Kwon, Seoul (KR); Young Sun Min, Hwaseong-si (KR); Dae Seok Byeon, Seongnam-si (KR); Sung Whan Seo, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 16/419,384

(22) Filed: May 22, 2019

(65) Prior Publication Data

US 2020/0126598 A1      Apr. 23, 2020

(30) Foreign Application Priority Data

Oct. 22, 2018   (KR) .......................... 10-2018-0125900

(51) Int. Cl.
  *G11C 5/14*  (2006.01)
(52) U.S. Cl.
  CPC .................................... *G11C 5/145* (2013.01)
(58) Field of Classification Search
  None
  See application file for complete search history.

(56) References Cited

U.S. PATENT DOCUMENTS

| | | | |
|---|---|---|---|
| 5,442,586 A | * | 8/1995 | Javanifard ............ G11C 16/30 365/185.29 |
| 5,656,946 A | | 8/1997 | Sim |
| 6,876,585 B2 | | 4/2005 | Choi et al. |
| 7,633,824 B2 | | 12/2009 | Kato |
| 7,982,530 B2 | | 7/2011 | Byeon |
| 8,867,278 B2 | | 10/2014 | Kang et al. |

(Continued)

FOREIGN PATENT DOCUMENTS

| KR | 10-0721899 B1 | 5/2007 |
|---|---|---|
| KR | 10-0811273 B1 | 2/2008 |

(Continued)

OTHER PUBLICATIONS

Palumbo et al., "Charge pump with adaptive stages for non-volatile memories", IEE Proc.—Circuits Devices Syst., vol. 153, No. 2, Apr. 2006. (Year: 2006).*

*Primary Examiner* — James G Norman
(74) *Attorney, Agent, or Firm* — Lee IP Law, PC

(57) ABSTRACT

A dynamic power control system includes an external power input terminal receiving a first output electric current from a power management circuit outside of the memory device; a variable charge pump receiving a second input voltage and a second input electric current, boosting the second input voltage to a second output voltage, and outputting the second output voltage and a second output electric current to the memory device; and a feedback controller to compare a ratio of the first output electric current to the first input electric current and a ratio of the second output electric current to the second input electric current, and to select one of the power management circuit and the variable charge pump to supply power to the memory device, according to the comparison result.

15 Claims, 7 Drawing Sheets

(56) References Cited

U.S. PATENT DOCUMENTS

| | | |
|---|---|---|
| 9,147,488 B2 | 9/2015 | Kim et al. |
| 9,437,317 B2 | 9/2016 | Kim et al. |
| 9,887,012 B2 | 2/2018 | Akahori et al. |
| 9,898,059 B2 | 2/2018 | Rotbard et al. |
| 9,979,282 B2 | 5/2018 | Fernald |
| 2016/0020694 A1* | 1/2016 | Fernald ............... G11C 5/145 |
| | | 327/536 |
| 2017/0262033 A1 | 9/2017 | Rotbard et al. |

FOREIGN PATENT DOCUMENTS

| | | |
|---|---|---|
| KR | 10-1030273 B1 | 4/2011 |
| KR | 10-1171206 B1 | 7/2012 |

* cited by examiner

DYNAMIC POWER CONTROL SYSTEM FOR MEMORY DEVICE AND MEMORY DEVICE USING THE SAME

CROSS-REFERENCE TO RELATED APPLICATION

Korean Patent Application No. 10-2018-0125900 filed on Oct. 22, 2018 in the Korean Intellectual Property Office, and entitled: "Dynamic Power Control System for Memory Device and Memory Device Using the Same," is incorporated by reference herein in its entirety.

BACKGROUND

1. Field

Embodiments relate to a dynamic power control system for a memory device, and a memory device using the same. More particularly, embodiments relate to a dynamic power control system for a memory device that dynamically selects and controls a type of charge source according to efficiency in a case of supplying a charge to a memory device, and a memory device using the same.

2. Description of the Related Art

In contrast to a dynamic random access memory (DRAM) or a static random access memory (SRAM), in which stored data is lost when power is turned off, in non-volatile memories, e.g., a NAND flash memory, data may be continuously stored even when no power is supplied. In NAND flash memory devices, a voltage used to drive a portion of circuits, e.g., a word line drive voltage, may be higher than an external supply voltage. Therefore, the semiconductor memory device may include a voltage boosting circuit that boosts the external power supply voltage.

NAND flash memory devices may be classified as a mobile type NAND flash memory or a solid state drive (SSD) type NAND flash memory, according to the application field or method. The mobile type NAND flash memory may be used in various portable electronic devices. In order to generate a high voltage without supplying power from an external power source, such mobile type memory devices may include a charge pump as one type of voltage boosting circuit. The SSD type memory may be used in an environment in which a power source is always connected, e.g., a desktop computer, and may receive continuous power from an external power source.

SUMMARY

According to an aspect, a dynamic power control system includes an external power input terminal receiving a first output electric current from a power management circuit present outside of the memory device; a variable charge pump receiving a second input voltage and a second input electric current, boosting the second input voltage to a second output voltage, and outputting the second output voltage and a second output electric current to the memory device; and a feedback controller controlling to compare a ratio of the first output electric current to the first input electric current and a ratio of the second output electric current to the second input electric current, and to select one of the power management circuit and the variable charge pump to supply power to the memory device, according to the comparison result.

According to an aspect, a memory device includes an external power input terminal receiving a first output electric current from a power management circuit present outside of the memory device; a variable charge pump receiving a second input voltage and a second input electric current, boosting the second input voltage to a second output voltage, and outputting the second output voltage and a second output electric current to the memory device; and a feedback controller controlling to select one of the power management circuit and the variable charge pump to supply power to the memory device, according to a comparison result between an electric current efficiency of the power management circuit and an electric current efficiency of the variable charge pump.

According to an aspect, a memory device includes an external power input terminal receiving a first output electric current from a power management circuit outside of the memory device; a variable charge pump receiving a second input voltage and a second input electric current, boosting the second input voltage to a second output voltage, and outputting the second output voltage and a second output electric current to the memory device; a first switch connecting the power management circuit and the memory device; a second switch connecting the variable charge pump and the memory device; and a feedback controller controlling the first switch and the second switch to open or close, according to a comparison result between an electric current efficiency of the power management circuit and an electric current efficiency of the variable charge pump.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
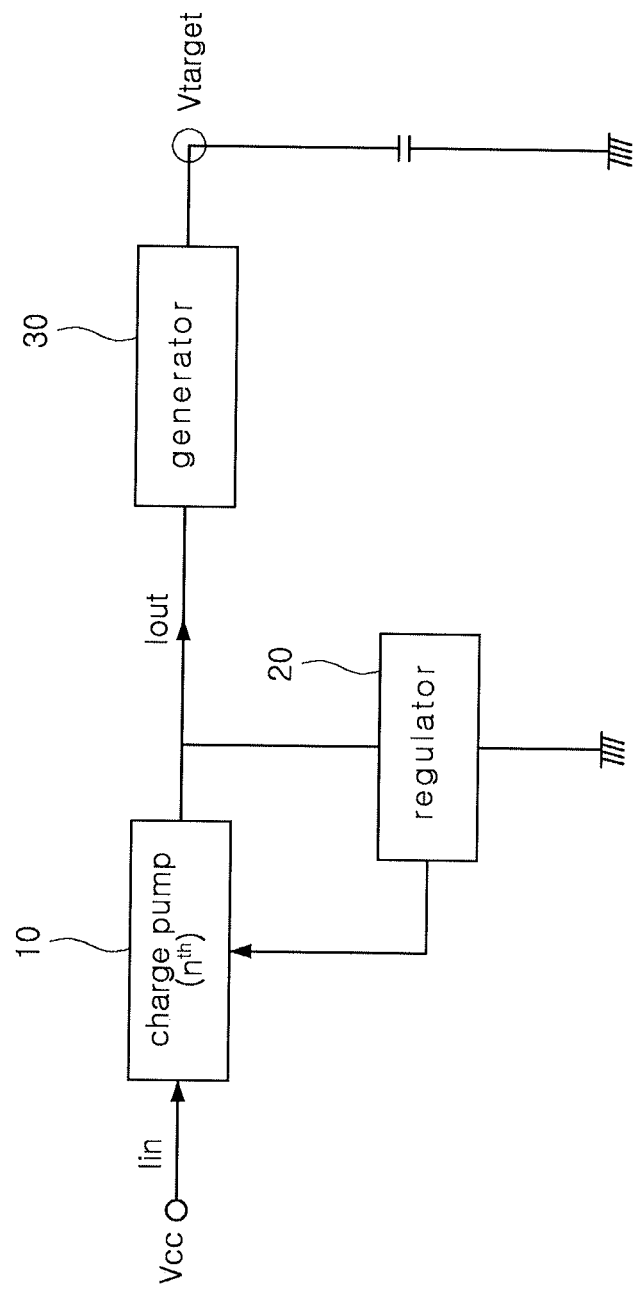
FIG. 1 illustrates a general configuration of a word line power supply system of a semiconductor memory.
Figure 2:
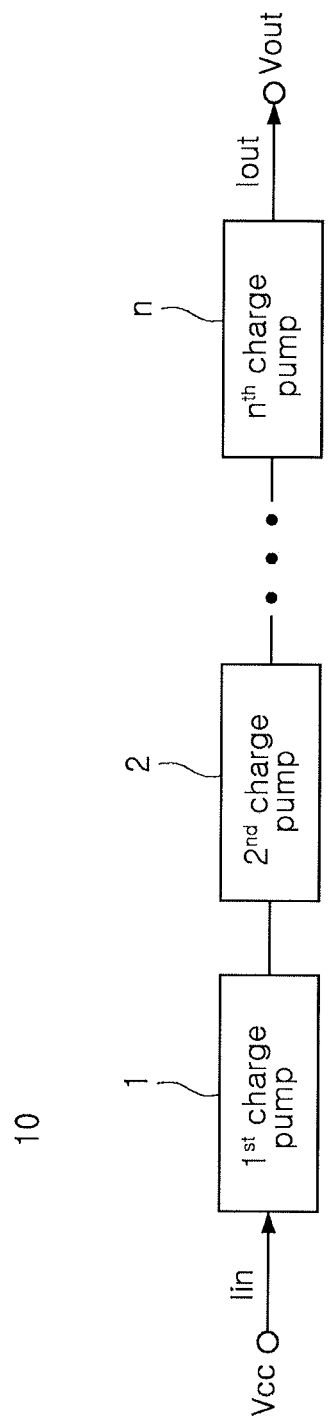
FIG. 2 illustrates a charge pump including a plurality of terminals.

FIG. 1 illustrates a general configuration of a word line power supply system of a semiconductor memory. FIG. 2 illustrates charge pump including a plurality of terminals.

FIG. 1 illustrates particularly only a portion regarding a power supply, e.g., a portion including a charge pump 10, in a word line power supply system of a general semiconductor memory. As illustrated in FIG. 2, the charge pump 10 may be a plurality of charge pumps connected in series.

An input voltage Vcc may be boosted and output after passing through a plurality of terminals, e.g., a total of n (n is an integer) terminals of the charge pump 10. Therefore, a voltage Vout output by the charge pump 10 has a value higher than the Vcc. Voltage and electric current values to be output may be in accordance with how many charge pumps are used in the charge pump 10 having a plurality of terminals 1 to n. The fixed number (n terminals) of charge pumps may be applied to the word line power supply system of the semiconductor memory according. A variable charge pump unit 120 according to an embodiment to be described below may selectively or partially utilize one of n terminals of charge pumps included in the variable charge pump unit 120 as needed.

In the present specification, a total of eight (8) terminals of charge pumps will be described as an example for convenience of explanation. As is apparent to those skilled in the art, two or more charge pumps may be employed.

Meanwhile, the present specification employs the term "electric current efficiency." The term electric current efficiency employed herein refers to a ratio of an electric current value output from the component to an electric current value input to the component.

For example, when an input electric current Iin is supplied by an input voltage Vcc at an input terminal of the charge pump 10 and an output electric current Iout is output by a boosted output voltage Vout at an output terminal, as illustrated in FIG. 2, electric current efficiency of the charge pump 10 may be expressed by (Iout/Iin). Meanwhile, on the basis of the fact that power of the input terminal may be equal to power of the output terminal in the charge pump 10, electric current efficiency may also be represented by (Vcc/Vout) as a voltage value.

Referring to FIG. 1 again, when the input electric current Iin is supplied to the input terminal word line power supply system of a semiconductor memory, e.g., at an input voltage Vcc of 2.5 V, the output electric current Iout may be output by the boosted voltage at an output terminal of the charge pump 10. Information on the output voltage may be supplied to the charge pump 10 through a regulator 20 and the output terminal voltage of the charge pump 10 may be maintained at a predetermined voltage, e.g., 12 V, through the regulator 20. In other words, the output terminal voltage of the charge pump 10 is generated using all charge pumps in the charge pump 10 and is a fixed value. A generator 30 may generate a target voltage Vtarget to be used in the semiconductor memory device from output terminal voltage of the charge pump 10. For example, the generator 30 may generate a target voltage of about 6.5V to 10V as needed and may provide the same to the semiconductor memory device.

Inherent capacitive components in the word line may be present in the semiconductor memory device, which may need to be charged every time power is supplied to the memory device. Thus, a more efficient supply of power may be warranted, e.g., to minimize charge consumption, to the maximize electric current efficiency.

For example, in FIG. 1, the power supplied to the input terminal may be defined as the product of the input voltage Vcc and the input electric current Iin. An amount of electric current consumed in the semiconductor memory device may be a certain fixed value, since the output electric current Iout value may charge the inherent capacitive component in the word line of the semiconductor memory device. In this regard, an increase in the electric current efficiency expressed by (Iout/Iin) means that the value of the input electric current Iin may be reduced. Therefore, a reduction in a value of the input electric current Iin with respect to the fixed input voltage means that the power supplied to the semiconductor memory device may be reduced. Thus, to increase the power efficiency of the semiconductor memory device, the electric current efficiency of the power supply system of the semiconductor memory device should be increased.

Figure 3:
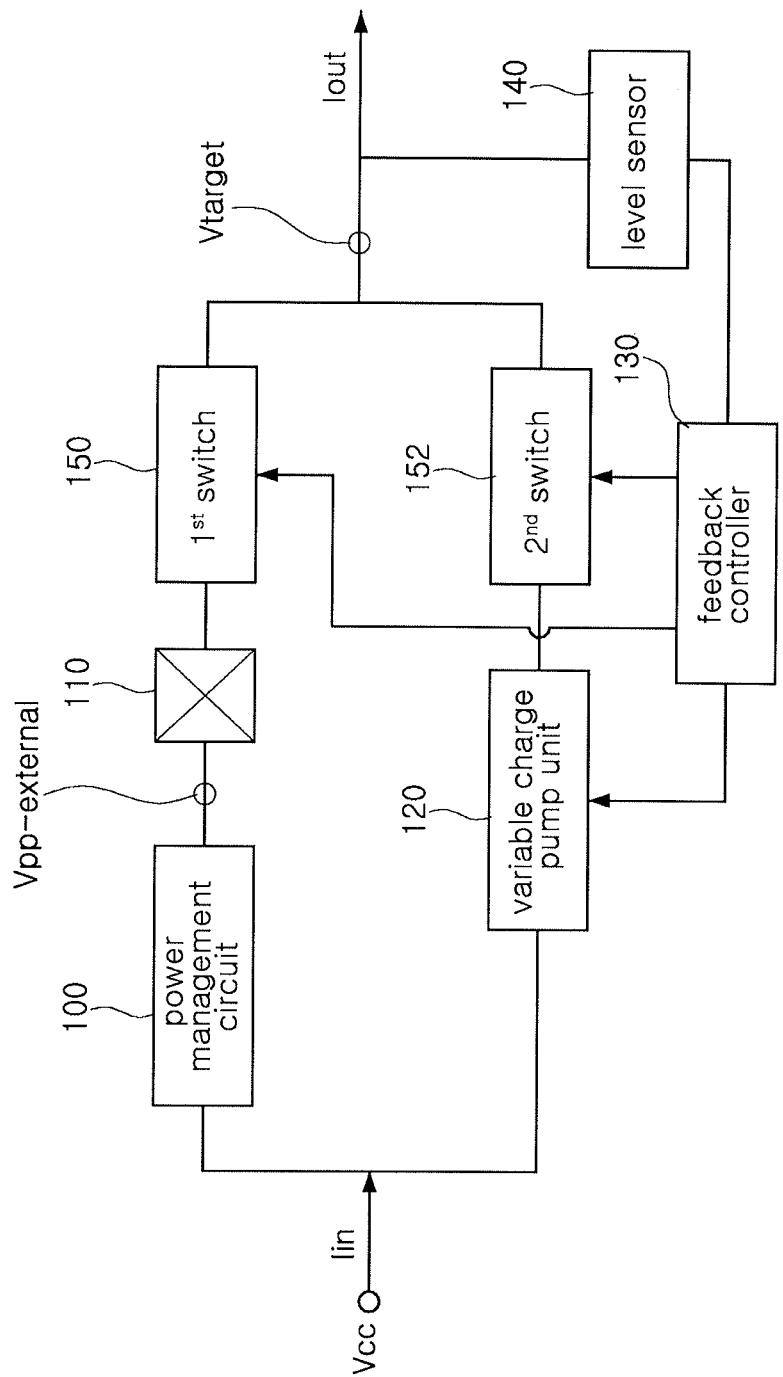
FIG. 3 illustrates a dynamic power control system of a memory device according to an embodiment.
Figure 4:
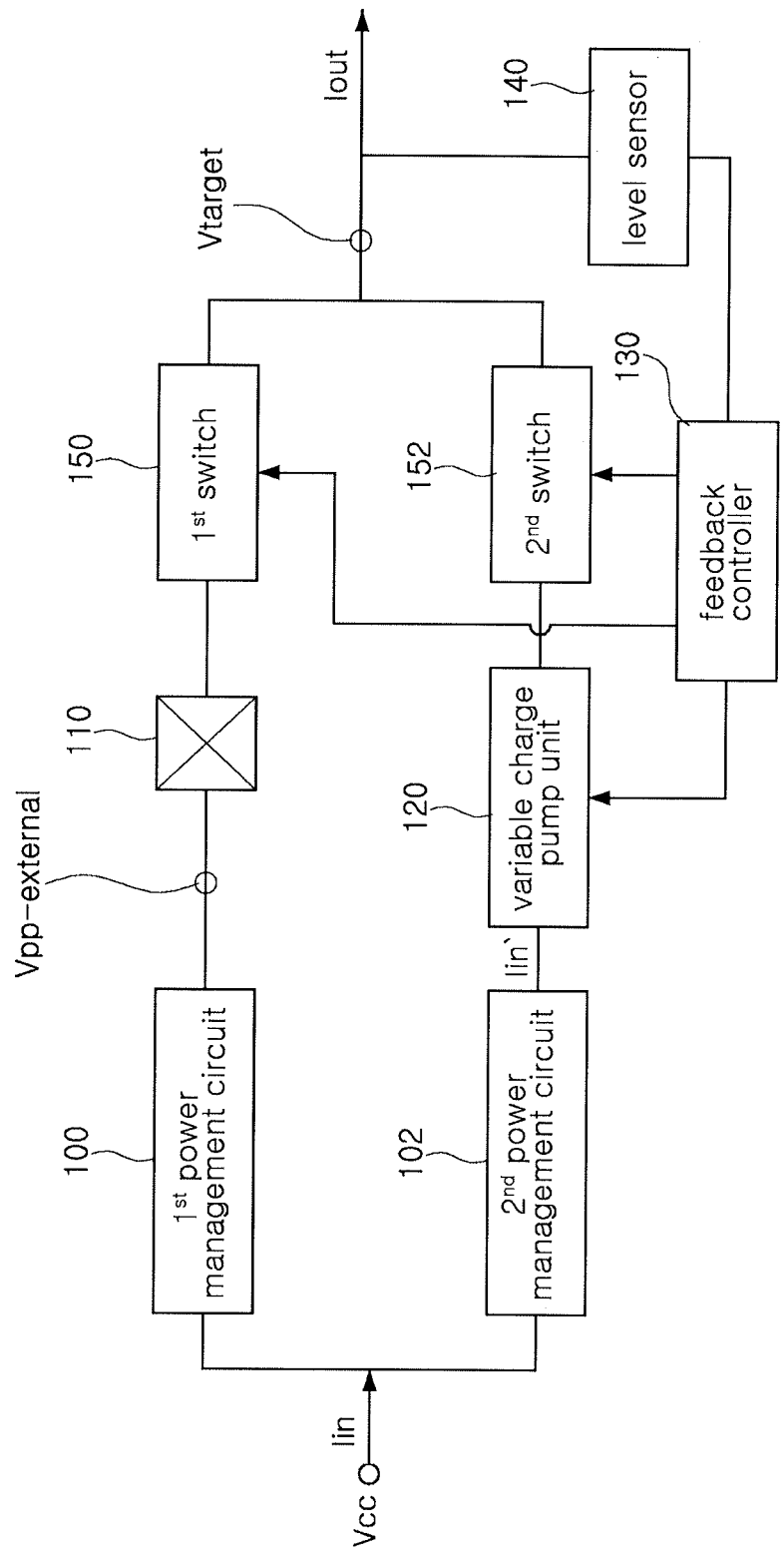
FIG. 4 illustrates a dynamic power control system of a memory device according to another embodiment.
Figure 5:
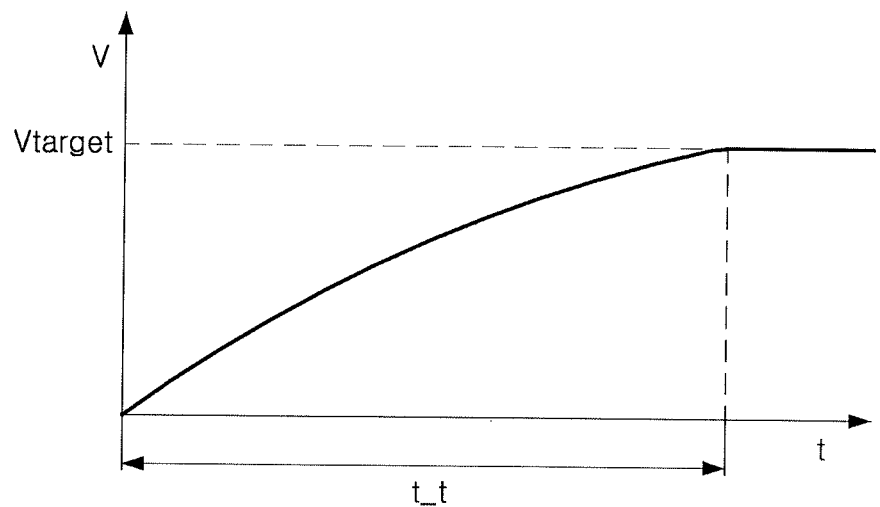
FIG. 5 illustrates a graph of a target voltage variation in a memory device power supply system according to a comparative method.
Figure 6:
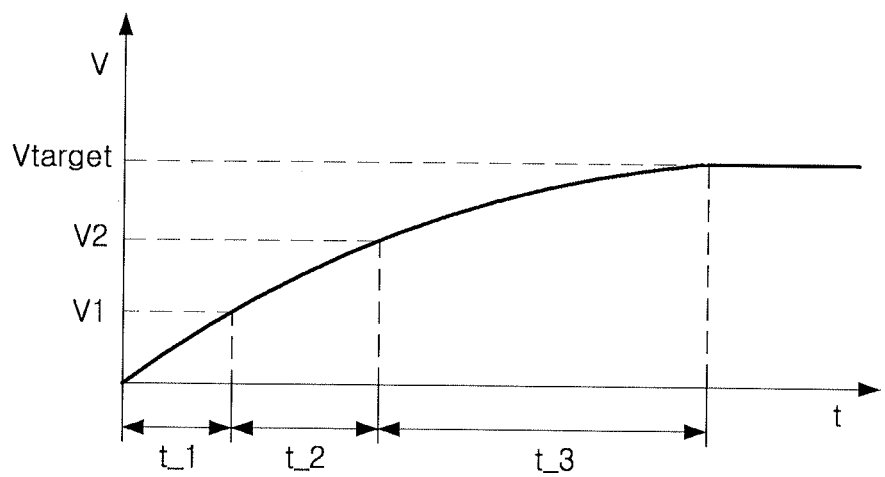
FIG. 6 illustrates a graph of a target voltage variation in a dynamic power control system of a memory device according to an embodiment.
Figure 7:
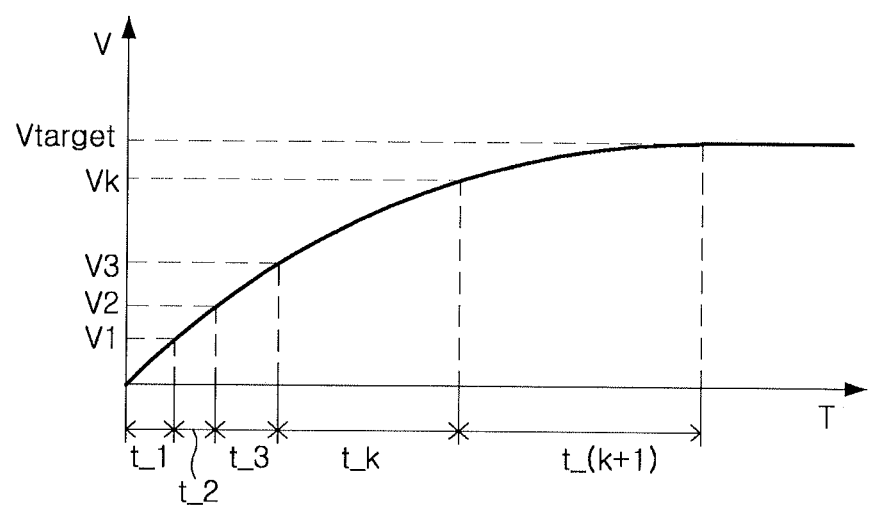
FIG. 7 illustrates a graph of a target voltage variation in a dynamic power control system of a memory device according to another embodiment.
Figure 8:
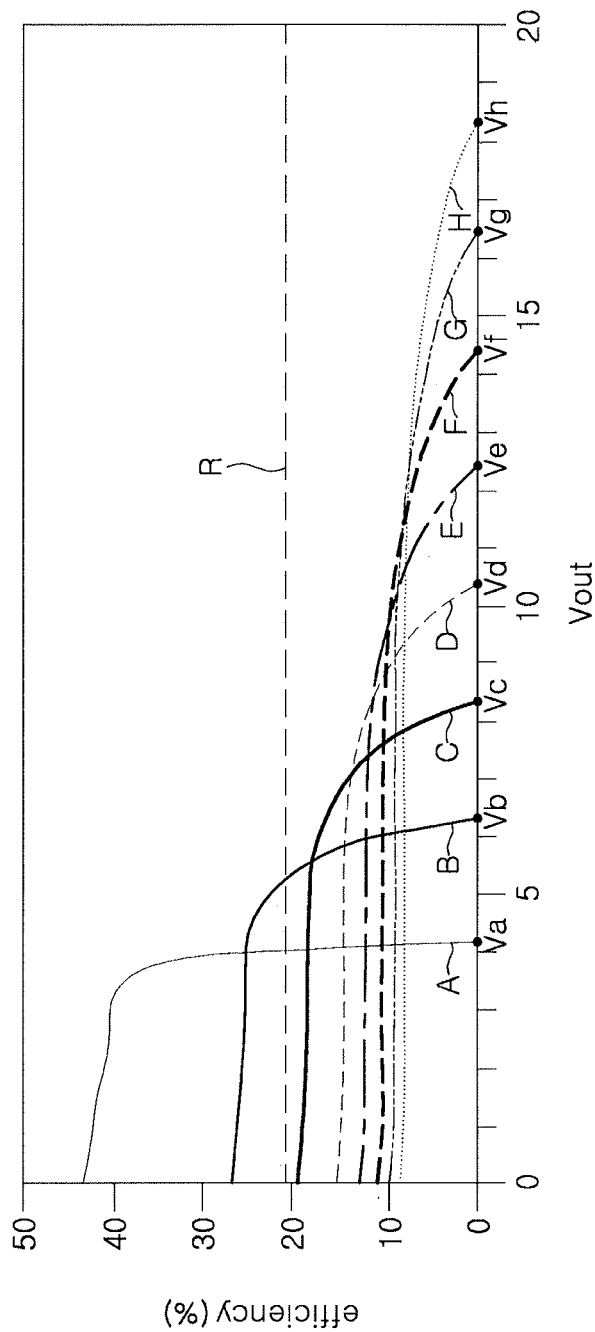
FIG. 8 illustrates a graph of an output voltage value and efficiency according to the number of operations of the charge pump included in the variable charge pump unit.

FIG. 3 illustrates a dynamic power control system of a memory device according to an embodiment. FIG. 4 illustrates a dynamic power control system of a memory device according to another embodiment. FIG. 5 is a graph of a target voltage variation in a memory device power supply system according to a comparative method. FIG. 6 is a graph of a target voltage variation in a dynamic power control system of a memory device according to an embodiment. FIG. 7 is a graph of a target voltage variation in a dynamic power control system of a memory device according to another embodiment. FIG. 8 is a graph of an output voltage value and efficiency according to the number of charge pump operated in the variable charge pump unit 120.

Referring to FIGS. 3 and 4, a semiconductor memory device according to an embodiment may include a power management circuit 100, the variable charge pump unit 120, and a feedback controller 130.

The power management circuit 100 may be also referred to as a power management integrated circuit (PMIC), and may be typically located outside of the semiconductor memory device to supply power to an SSD type semiconductor memory device. The power management circuit 100 may also receive a first input voltage Vcc and a first input electric current Iin from an external power source, and may output a first output voltage and a first output electric current to the memory device.

The variable charge pump unit 120 may receive a second input voltage and a second input electric current, boost the second input voltage to a second output voltage, and output the second output voltage and a second output electric current to the memory device. The second input voltage and the second input electric current received by the variable charge pump unit 120 may be values of Vcc and Iin, respectively, as illustrated in FIG. 3.

The values of Vcc and Iin may be adjusted through a second power management circuit 102 to provide the adjusted values to a variable charge pump unit 120, as illustrated in FIG. 4, while the power management circuit 100 of the FIG. 3 may serve as a first power management circuit 100. In this case, the voltage value and the electric current value Iin' adjusted through the second power management circuit 102 may correspond to a second input voltage and a second input electric current, respectively.

The feedback controller 130 may compare an electric current efficiency of the power management circuit 100 and an electric current efficiency of the variable charge pump unit 120. The feedback controller 130 may dynamically select one of the power management circuit 100 and the variable charge pump unit 120 to supply power to the memory device, according to the comparison result.

Hereinafter, an example will be described with concrete numerical values that are merely illustrative. Referring to FIG. 3, when 2.5 V is input as the input voltage Vcc and the input voltage is boosted to 12 V through the power management circuit 100, an electric current efficiency of the power management circuit 100 may be (2.5 V/12 V) and may thus have a value of about 20.8%.

According to the comparative power supply system for the SSD type semiconductor memory device, an external power supply network may be used to supply power statically. For example, as illustrated in FIG. 5, power having a constant magnitude of efficiency may be supplied during a total period t_t for charging a capacitive component in the semiconductor memory device. According to the respective numerical conditions assumed in the above-described example, the comparative power supply system for the semiconductor memory device may charge the capacitive component of the memory device while maintaining a constant electric current efficiency of 20.8%.

The variable charge pump unit 120 according to embodiments may include a first charge pump to an $n^{th}$ charge pump. One, some, or all of the first charge pump to the $n^{th}$ charge pump may be selectively operated, wherein n is an integer of 2 or more. FIG. 8 illustrates an output voltage value and efficiency according to the number of charge pumps being operated in the variable charge pump unit 120.

Referring to FIG. 8, when the number of charge pumps to be operated is one (1), the electric current efficiency of the variable charge pump unit 120 may be more than about 40%. When the number of charge pumps to be operated is two (2), the electric Current efficiency of the variable charge pump unit 120 may be about 25 to 27%. When the number of charge pumps to be operated is three (3), the electric current efficiency may be slightly less than 20%. In addition, when the number of charge pumps to be operated is four (4) or more, electric current efficiency may be less than the above values. A dashed line R indicates a reference efficiency of 20.8% of FIG. 5.

As illustrated in FIG. 8, values Va to Vh at which curves A to H intersect the output voltage Vout axis indicates a maximum Vout output value for the number of charge pumps operated. The curves A to H are graphs in which the numbers of charge pumps operated are one to eight, respectively. In consideration of the above, the supply efficiency may be maximized by supplying power to the semiconductor memory device, considering changes of the voltage value applied to the capacitive component during a charging process of the semiconductor memory device in real time.

For example, the feedback controller 130 may compare an electric current efficiency of the power management circuit 100, e.g., a ratio of the first output electric current to the first input electric current, and electric current efficiency of the variable charge pump unit 120. e.g., a ratio of the second output electric current to the second input electric current, and may dynamically select one of the power management circuit 100 and the variable charge pump unit 120, in which a portion of the first charge pump to the $n^{th}$ charge pump operate, to supply power to the memory device, according to the comparison result.

The electric current efficiency of the power management circuit 100 may be a ratio of the first output electric current to the first input electric current as described above, or a ratio of the first input voltage to the first output voltage of the power management circuit 100, on the basis of the fact that power of the input terminal and power of output terminal in the power management circuit 100 are the same. In a similar manner, the electric current efficiency of the variable charge pump unit 120 may be a ratio of the second output electric current to the second input electric current as described above or a ratio value of the second input voltage to the second output voltage of the variable charge pump unit 120.

The feedback controller 130 may provide the variable charge pump unit 120 with information on the number of charge pumps to be operated among the n charge pumps in the variable charge pump unit 120, according to a comparison result between an electric current efficiency of the power management circuit 100 and an electric current efficiency of the variable charge pump unit 120. The variable charge pump unit 120 may selectively operate one, some, or all of the first to the $n^{th}$ charge pump, according to the information on the number of charge pumps to be operated from the feedback controller 130. In addition, the feedback controller 130 may change the number of variable charge pumps to be operated among the first charge pump to the $n^{th}$ charge pump, according to a comparison result between an electric current efficiency of the power management circuit 100 and an electric current efficiency of the variable charge pump unit 120, to supply power to the memory device.

More specifically, e.g., the electric current efficiency of the power management circuit 100 may have a value of about 20.8% as illustrated by the dotted line R in FIG. 8. When the number of charge pumps to be operated is one (1), the electric current efficiency of the variable charge pump unit 120 may be more than about 40%. When the number of charge pumps to be operated is two (2), the electric current efficiency of the variable charge pump unit 120 may be about 25 to 27%. Therefore, it is more efficient to supply power by using the variable charge pump unit 120 rather than the power management circuit 100 for a certain period in a process of increasing voltage applied to the capacitive component 40 in the semiconductor memory device during a charging period.

For example, when the voltage to be applied to the memory device is less than or equal to Va, e.g., 3V, the number of charge pumps to be operated in the variable charge pump unit 120 may be set to one (1) during a period t_1. When the voltage to be applied to the memory device is greater Va and less than or equal to Vb, e.g., 5V, the number of charge pumps to be operated in the variable charge pump unit 120 may be set to two (2) during a period t_2. When the voltage to be applied to the memory device is greater than Vb, such that more than two charge pumps would be selected, the power management circuit 100 may supply the voltage to the memory device until a final target voltage Vtarget during a period t_3.

A curve of a voltage applied to the memory device controlled by the feedback controller 130 through the above described embodiment is illustrated in FIG. 6. According to the embodiment described above, V1, e.g., 3V, is less than or equal to Va, and V2, e.g., 5V, is greater than Va and less than or equal to Vb.

The dynamic power control system for the memory device according to an embodiment may further include the first switch 150 connecting the power management circuit 100 and the memory device, and the second switch 152 connecting the variable charge pump unit 120 and the memory device. The feedback controller 130 may transmit a control signal to the first switch 150 or the second switch 152, according to the comparison result. In other words, the feedback controller 130 may turn on the first switch 150 to connect the power management circuit 100 to the memory device when the power management circuit 100 is selected and may turn on the second switch 152 to connect the variable charge pump unit 120 to the memory device when variable charge pump unit 120 is selected.

A level sensor 140 may further be included to sense a variation of a target voltage Vtarget value supplied to the memory device in real time and provide the sensed voltage value to the feedback controller 130. The feedback controller 130 may compare a predetermined reference value with the sensed voltage value to determine when to select one of the power management circuit 100 and the variable charge pump unit 120. In addition, the feedback controller 130 may compare a predetermined reference value with the sensed voltage value to determine when to change a number of variable charge pumps to be operated among the first charge pump to the $n^{th}$ charge pump.

In addition to determine when to change a number of variable charge pumps to be operated among the first charge pump to the $n^{th}$ charge pump according to the comparison of the voltage values, when a number of the variable charge pumps to be operated may be predetermined in advance and may be dynamically changed according to the predetermined point in time, without having to measure the voltage value in real time and compare with the reference value in actual operation.

In the above-described embodiment, a power control system in which the variable charge pump unit 120 is dynamically converted to the power management circuit 100 when one and two charge pumps are operated. The number of charge pumps to be operated may change depending on the electric current efficiency of the variable charge pump unit 120, and the electric current efficiency of the power management circuit 100, respectively. For example, with the technology for the charge pump increase the efficiency thereof, the maximum electric current efficiency and the maximum output voltage each provided by the charge pump may be increased. Therefore, the curves A to H illustrated in FIG. 8 may be different. In addition, the electric current efficiency value of the power management circuit 100 and the second power management circuit 102 may be changed, depending values of the input voltage values Vcc of the power management circuit 100 illustrated in FIG. 3 and the first power management circuit 100 illustrated in FIG. 4 have, values of the electric current value fin input to and the electric current value Iin' output from the second power management circuit 102 illustrated in FIG. 4 have, and the like.

Therefore, how many charge pumps to be operated in the variable charge pump unit 120 are sequentially operated will be specifically changed depending on the specific situation, and a graph representing this in general is illustrated in FIG. 7. For example, when k charge pumps are operated, if the electric current efficiency of the variable charge pump unit 120 is greater than the electric current efficiency of the power management circuit 100, the feedback controller 130 may control to supply power to the semiconductor memory device by the variable charge pump unit 120 during to t_k periods, and to supply power by the power management circuit 100 during t_(k+1) period.

Embodiments may also provide a memory device to which the dynamic power control system of the memory device described above is applied. As shown in FIGS. 3 and 4, the memory device according to an embodiment may include an external power input terminal 110, the variable charge pump unit 120, and the feedback controller 130. The first switch 150 and the second switch 152 may further be included according to another embodiment, and the level sensor 140 may further be included according to another embodiment.

The external power input terminal 110 may receive a first output electric current from a power management circuit outside of the memory device and may transfer the first output electric current to the memory device. The external power input terminal 110 may receive a voltage Vpp that is higher than Vcc for use by the memory device. When the voltage Vpp is supplied through the external power input terminal, the feedback controller 130 may select the voltage Vpp when the voltage Vpp equals the target voltage Vtarget and may otherwise select the variable charge pump unit 120, or between the variable change pump unit 120 and the power management circuit 100, if included, as described above.

The feedback controller 130 may use the first and second switches as described above to connect the external power input terminal 110 and the variable charge pump unit 120 to the memory device. Otherwise, elements are as described above with reference to FIGS. 3, 4, and 6 to 8.

The term "unit," for example, "module" or "table" used in the present embodiment may refer to software components, and hardware components such as a field programmable gate array (FPGA) or an application specific integrated circuit (ASIC), and the module performs certain functions. The module is not meant to be limited to software or hardware components. The module may be configured to be stored on an addressable storage medium, and configured to play one or more processors. The module may include components such as software components, object-oriented software components, class components, and task components, and processes, functions, attributes, procedures, subroutines, segments of program code, drivers, firmware, microcode, circuitry, data, databases, data structures, tables, arrays, and variables, as will be appreciated by those skilled in the art. The functions provided in the components and modules may be combined into a smaller number of components and modules, or may be further separated into additional components and modules. In addition, components and modules may be implemented to reproduce one or more CPUs in the device.

According to the embodiments of the dynamic power control system or the memory device using the same, dynamically controlling the type of the power source and detailed operations within the power source, based on the time-dependent power supply efficiency of each of the two or more types of power sources supplying power to the memory device, the power supply efficiency of the system or memory device may be optimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A dynamic power control system for a memory device, comprising:
a power management circuit receiving a first input electric current and outputting a first output electric current to the memory device;
a variable charge pump receiving a second input voltage and a second input electric current, boosting the second input voltage to a second output voltage, and outputting the second output voltage and a second output electric current to the memory device; and
a feedback controller to select one of the power management circuit and the variable charge pump to supply power to the memory device,
wherein:
the variable charge pump includes a first charge pump to an $n^{th}$ charge pump, n being an integer of 2 or more, the feedback controller is connected to the variable charge pump, and changes a number of charge pumps that are operated among the first charge pump to the $n^{th}$ charge pump, the variable charge pump is configured to selectively activate one of the first charge pump to the $n^{th}$ charge pump, the variable charge pump is configured to selectively activate all of the first charge pump to the $n^{th}$ charge pump, and the feedback controller is to:
  select one of the power management circuit and the variable charge pump, and
  supply power to the memory device, according to a comparison result between a ratio of the first output electric current to the first input electric current and a ratio of the second output electric current to the second input electric current.

2. The dynamic power control system according as claimed in claim 1, wherein:
  the feedback controller provides the variable charge pump with information on a number of charge pumps to be operated among the n charge pumps included in the variable charge pump, according to the comparison result, and
  the variable charge pump selectively operates one, some, or all of the first to the $n^{th}$ charge pump, according to the information on the number of charge pumps to be operated.

3. The dynamic power control system according as claimed in claim 1, wherein the feedback controller is to change a number of charge pumps to be operated among the first charge pump to the $n^{th}$ charge pump, according to the comparison result, to supply power to the memory device.

4. The dynamic power control system according as claimed in claim 1, further comprising:
  a first switch connecting the power management circuit and the memory device, and
  a second switch connecting the variable charge pump and the memory device,
  wherein the feedback controller transmits a control signal to the first switch and the second switch, according to the comparison result.

5. The dynamic power control system according as claimed in claim 1, further comprising a level sensor sensing a variation of a target voltage value supplied to the memory device and providing the sensed voltage value to the feedback controller.

6. The dynamic power control system according as claimed in claim 5, wherein the feedback controller compares a reference value with the sensed voltage value to determine when to select one of the power management circuit and the variable charge pump.

7. The dynamic power control system according as claimed in claim 5, wherein the feedback controller compares a reference value with the sensed voltage value to determine when to change a number of charge pumps to be operated among the first charge pump to the $n^{th}$ charge pump, according to the comparison result.

8. The dynamic power control system according as claimed in claim 7, wherein the reference value is predetermined to be a value lower than a maximum voltage value output from the variable charge pump, according to a number of the charge pump being operated.

9. A memory device, comprising:
  an external power input terminal receiving a first output electric current from a power management circuit outside of the memory device, the power management circuit receiving a first input electric current and outputting the first output electric current to the memory device;
  a variable charge pump receiving a second input voltage and a second input electric current, boosting the second input voltage to a second output voltage, and outputting the second output voltage and a second output electric current to the memory device; and
  a feedback controller to select one of the power management circuit and the variable charge pump to supply power to the memory device, according to a comparison result between an electric current efficiency of the power management circuit and an electric current efficiency of the variable charge pump, wherein:
  the variable charge pump includes a first charge pump to an $n^{th}$ charge pump, n being an integer of 2 or more,
  the feedback controller is connected to the variable charge pump, and changes a number of charge pumps that are operated among the first charge pump to the $n^{th}$ charge pump,
  the variable charge pump is configured to selectively activate one of the first charge pump to the $n^{th}$ charge pump,
  the variable charge pump is configured to selectively activate all of the first charge pump to the $n^{th}$ charge pump, and
  the feedback controller is to:
    select one of the power management circuit and the variable charge pump, and
    supply power to the memory device, according to a comparison result between a ratio of the first output electric current to the first input electric current and a ratio of the second output electric current to the second input electric current.

10. The memory device according as claimed in claim 9, wherein:
  the electric current efficiency of the power management circuit is a ratio of the first output electric current to a first input electric current input to the power management circuit, and
  the electric current efficiency of the variable charge pump is a ratio of the second output electric current to the second input electric current.

11. The memory device according as claimed in claim 9, wherein:
  the feedback controller provides the variable charge pump with information on a number of charge pumps to be operated among the n charge pumps included in the variable charge pump, according to the comparison result, and
  the variable charge pump selectively operates one, some, or all of the first to the $n^{th}$ charge pump, according to the information on the number of charge pumps to be operated.

12. The memory device according as claimed in claim 9, wherein the feedback controller is to change the number of charge pumps to be operated among the first charge pump to the $n^{th}$ charge pump, according to the comparison result, to supply power to the memory device.

13. The memory device according as claimed in claim 9, further comprising a level sensor sensing a variation of a target voltage value supplied to the memory device and providing the sensed voltage value to the feedback controller.

14. The memory device according as claimed in claim 13, wherein the feedback controller compares a predetermined reference value with the sensed voltage value to determine when to select one of the power management circuit and the variable charge pump.

15. The memory device according as claimed in claim 13, wherein the memory device is a solid state drive (SSD) type memory device.

* * * * *